United States Patent [19]

Samek

[11] Patent Number: 4,533,217
[45] Date of Patent: Aug. 6, 1985

[54] LIGHT GATE ASSEMBLIES, ELEMENTS AND MANUFACTURING METHODS

[75] Inventor: Norbert E. Samek, Sierra Madre, Calif.

[73] Assignee: Transamerica Delaval Inc., Lawrenceville, N.J.

[21] Appl. No.: 423,496

[22] Filed: Aug. 9, 1982

Related U.S. Application Data

[62] Division of Ser. No. 34,894, Apr. 30, 1979, Pat. No. 4,478,495.

[51] Int. Cl.³ .............................................. G02F 1/03
[52] U.S. Cl. ...................................................... 350/392
[58] Field of Search ............................ 350/392–393; 174/68.5; 339/17 LC, 17 LM, 17 M

[56] References Cited

U.S. PATENT DOCUMENTS

| | | | |
|---|---|---|---|
| 2,909,973 | 10/1959 | Koelsch, Jr. et al. | 350/392 |
| 3,105,922 | 10/1963 | Fukui et al. | 361/404 |
| 3,521,271 | 7/1970 | Rappaport | 350/392 |
| 3,659,270 | 4/1972 | Maldonado et al. | 350/392 |
| 3,778,681 | 12/1973 | Wilson | 339/17 LC |
| 3,868,608 | 2/1975 | Williams | 350/392 |
| 4,316,196 | 2/1982 | Jacobs | 350/393 |

FOREIGN PATENT DOCUMENTS

| | | | |
|---|---|---|---|
| 1239226 | 7/1960 | France | 339/17 M |

OTHER PUBLICATIONS

Zak, Advertisement Zak Breadboards, 3-1955, pp. 3-7.
Cutchen et al., "Electrooptic Devices Utilizing Quadratic Plzt Ceramic Elements", 1973 Wescon Tech. Papers, Sec. 30/2.
Hacking et al., "Digital Recording Using Hologram Arrays: Laserbeam Deflection & Modulation", BBC Research Dept. Rept. BBC RD 1979/6, 3-1979, pp. 15-21.

Primary Examiner—William H. Punter
Attorney, Agent, or Firm—Benoit Law Corporation

[57] ABSTRACT

Elongate light gate structures are composed of a plurality of individual chips of electrooptically active light gate material displaying field induced birefringence. The individual chips are provided in rectangular configuration. Each chip has a plurality of alternating electrodes and elongate light gate regions distributed there along. A rigid mounting beam has a pair of spaced parallel elongate mounting surfaces for the light gate chips and an elongate opening located between and extending along these mounting surfaces for the flow of light to or from the mounted chips. The chips may be retained on the rigid beam by chip mounting chips. The chips may be located between polarizer and analyzer filters. Driver circuit boards may be interfaced with and appropriately leveled relative to the mounted chips.

31 Claims, 7 Drawing Figures

LIGHT GATE ASSEMBLIES, ELEMENTS AND MANUFACTURING METHODS

This is a division of application Ser. No. 06/034,894, filed Apr. 30, 1979, for Light Gate Assemblies, Elements and Manufacturing Methods, now U.S. Pat. No. 4,478,495.

BACKGROUND OF THE INVENTION

1. Field of the Invention

The subject invention relates to electrooptical systems, to light gate structures, assemblies, modules and elements, and to method of providing or preparing same.

2. Disclosure Statement

This disclosure statement is made pursuant to the duty of disclosure imposed by law and formulated in 37 CFR 1.56(a). No representation is hereby made that information thus disclosed in fact constitutes prior-art inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material.

Various electrooptical light gate systems have been proposed in diverse fields of utility. For instance, an article by J. Thomas Cutchen et al, entitled Electrooptic Devices Utilizing Quadratic PLZT Ceramic Elements, published in 1973 WESCON TECHNICAL PAPERS, Vol. 17, part 30, pp. 30/2 et seq., and an article by the same authors entitled PLZT Electrooptic Shutters: Applications, APPLIED OPTICS, Vol. 14, No. 8 (August 1975), pp. 1866 et seq., describe electrooptic ceramics and devices employing transparent lanthanum-modified lead zirconate titanate (PLZT), and applications thereof, including page composers, display devices, eye protection devices, industrial welding protection, large aperture photographic shutters and variable density filters.

Reference is also made to the extensive bibliography of these two articles, hereby incorporated by reference herein.

Facsimile apparatus for writing and reading mechanically moving documents with an electronically controllable switching mask plate, disposed between polarization filters and consisting of a material containing mixed crystals of lead zirconate and lead titanate, and doped with lanthanum, and provided with aligned electrodes, was proposed in U.S. Pat. No. 3,930,119, by Rolf Schmidt et al, issued Dec. 30, 1975.

That proposal contemplated use of a switch mask plate having a large number of electrodes arranged in line with one another, or then employment of a plurality of ceramic plates provided with electrodes and stacked so that light beams could be masked according to a raster between the electrodes of the individual plates.

A further proposal is apparent from British Patent Specification No. 1,534,027, by Battelle Memorial Institute, published Nov. 29, 1978. That proposal employs light modulating elements which are arranged side by side, and each of which has the form of an electrooptical shutter. Electrode arrangements are also shown which have comblike electrode configurations, or similar arrangement with a grounded serpentine common electrode located on both major sides of a ceramic plate, with spatial coincidence or registration existing among corresponding electrodes on the two substrate faces.

Improved light gate utilization methods and apparatus, with special optical systems, were disclosed in German Patent Publication No. 28 09 997, filed by the subject assignee, published Sept. 21, 1978, and herewith incorporated by reference herein.

For many applications, including oscillographs and facsimile apparatus, it is desirable to have elongate light gate structures having a length of more than twenty centimeters or preferably in the foot (about 30 cm) range. To build a shutter array of this length without visible gaps and without distortion in linearity it has been proposed to deposit PLZT or similar material on a suitable compatible substrate by sputtering. Matching of the thermal expansion of the substrate and of the ferroelectric deposit becomes, however, a major problem at larger lengths. A mismatch in thermal expansion causes strain bias in the deposited ferroelectric film, affecting the rotation of the polarization vector of the transmitted light.

Another method of manufacturing ferroelectric ceramic chips is by hot-pressing and sintering cylindrical slugs which are subsequently cut into wafers or chips and optically polished. Production processes for practising this method, however, impose limits on the maximum size of chips which can be economically manufactured. In practice, this maximum size is several times smaller than the above mentioned desired lengths.

In a similar vein, ferroelectric ceramic chips or other substrates of electrooptically active material are very strain and temperature sensitive. They also are vulnerable to light-induced birefringence, affecting light transmission and quality of performance.

Mounting of ferroelectric ceramic substrates also has been a problem in terms of differential thermal expansion between substrate and mounting structure. Piezoelectric effects in the light gate material and dimensional changes resulting therefrom also have caused problems at the substrate/mounting structure interface.

Interfacing the electrodes on the light gate substrate with the driving electronic circuitry has given rise to various problems, especially when thin film systems, such as employed for providing the driving electrodes for the light gates, are desired to be interfaced with thick film systems of which the driving electronics could be most economically manufactured.

In practice, these problems are compounded by the inevitable generation of heat by the electronic circuits and equipment driving the light gate arrays. Electrooptical materials are particularly vulnerable to performance degradation by induced temperature gradients and by the temperature exposure itself.

These problems are also compounded by the need to mount light polarizing filters and lenses adjacent the light gate structure in practical systems.

Further problems stem from the vulnerability of electrooptical systems and their performance to dust and other contaminants.

In U.S. Pat. No. 3,873,187, by Robert E. Brooks, issued Mar. 25, 1975, it has been proposed to cut grooves through a layer of PLZT or other electrooptically active material and into a supporting substrate and to form electrodes by placing wires and conductive paste into these cut grooves. Where it would not be possible to form a single strip of light gate arrays in a single desired length, that reference suggests disposing several individual rectangular strips end to end, care being taken that they precisely butt each other where saw cuts will occur.

One of the more visible problems of such a proposal is that a provision of electrode-receiving grooves with a saw or by means of a similar mechanical machining process practically limits the electrode configuration to straight lines. Such straight lines typically have to extend across the full width of the PLZT layer or the substrate, rendering it difficult, if not practically impossible, to provide greater center-to-center distances between adjacent electrode terminals than the center-to-center spacing between the electrodes to which these terminals are connected. Also, saw cutting or similar machining inevitably causes chipping of the edges and of the surface, internal stresses near the cut edges and mechanical weakening of the PLZT layer or of the substrate due to the notch effect of the cut grooves.

Another problem that has so far beset electrooptical light gate systems, such as PLZT light shutters or gate arrays, may be designated as "light induced birefringence." Such undesired birefringence occurs, for instance, when light gates are illuminated at high intensity while electric fields are applied to the gates, such as to place the gates in their ON condition. In short, light induced birefringence degrades the performance of light gates, and particularly their light transmitting capability.

While no limitation to or dependence on any particular theory is intended, it may be observed that a cause of light induced birefringence is believed due to photoexcitation of electrons in the illuminated region where electrons can reach the conduction state and drift under the influence of the applied field. Such photoinduced charge carriers are being trapped in the dark regions of the electrooptical material layer; particularly to close proximity to the edges of the electrode deposits. In brief, the trapped photoinduced charge carriers generate a space charge field which acts against the field applied to the electrodes and gating regions. The localized charge at the boundary of the illuminated area grows at a rate proportionate to the difference of free carrier concentration in the illuminated and in the dark areas. By way of example, up to 45% decrease in light transmission was observed with PLZT light gate arrays after 90 minutes of intense illumination.

Especially with PLZT light gate systems, the rule of thumb has developed that the interelectrode spacing, that is, the spacing between immediately adjacent electrodes, should not be smaller than the thickness of the layer of electrooptically active material. Such relationship, in effect, provides a favorable distribution of the applied electric fields throughout the thickness of the electrooptically active material, thereby reducing the above mentioned light induced birefringence effect. However, The latter rule of thumb places severe restrictions on a reduction of interelectrode spacing for a given thickness of the electrooptically active substrate or layer. As a result, existing systems are either subject to light induced birefringence at a detrimental rate or suffer a severe limitation on the attainment of desirable properties, such as an achievement of high resolution.

Prior proposals, such as those contained in the above mentioned Schmidt et al patent or in U.S. Pat. No. 3,799,647, by Victor Luft, offer no solution of this serious problem.

SUMMARY OF THE INVENTION

It is a general object of this invention to overcome disadvantages and to satisfy the needs expressed or implicit in the disclosure statement herein set forth.

It is a related object of this invention to provide improved electrooptic systems.

It is a related object of this invention to provide improved light gate structures and methods of making same.

It is also an object of this invention to provide methods of composing elongate light gate structures of a plurality of individual chips, and improved elongate light gate structures so composed.

It is also an object of this invention to provide improved chips of electrooptically active light gate material and improved methods of preparing same.

It is also an object of this invention to provide improved mounting systems, structures and elements for electrooptically active substrates and chips.

It is also an object of this invention to provide improved electrooptical light gate and filter combinations.

It is also an object of this invention to provide improved thin film/thick film interfacing systems.

It is a germane object of this invention to provide improved interfacing between electrode arrays on electrooptically active chips or other substrates and driving electronic circuitry.

It is also an object of this invention to alleviate or overcome the effects of various temperature and stress-induced disturbances.

It is also an object of this invention to improve the performance of electrooptically active light gate systems.

It is a related object of this invention to reduce light induced birefringence in electrooptical systems.

It is also an object of this invention to provide improved circuit board mounting and interfacing methods and apparatus.

Other objects will become apparent in the further course of this disclosure.

From one aspect thereof, the subject invention resides in a method of composing an elongate light gate structure of a plurality of individual chips of electrooptically active light gate material displaying field induced birefringence. More specifically, the invention according to this aspect resides in the improvement comprising in combination the steps of providing said chips in rectangular configuration having parallel first and second sides and parallel edges extending between said sides, providing on each chip a plurality of alternating electrodes and elongate light gate regions extending parallel to said first and second sides of the rectangular configuration, subdividing the spaced parallel electrodes on each chip into complete first and second electrode arrays alternating with each other along an elongate region of said chip, allocating to each of said electrode arrays a plurality of said electrodes, providing on one side of said elongate region of said chip first individual terminals for the electrodes in each first electrode array, spacing any first individual terminal of any one of the electrodes in any of said first electrode arrays from the first individual terminal of any other electrode in the particular first electrode array by a center-to-center distance greater than the center-to-center spacing between said one electrode and said other electrode, while arranging said first individual terminals side by side along one of said parallel edges to provide each first individual terminal with an individual connecting lead path being free of any other terminal and intersecting a plane through said one of said parallel edges for connection of a lead to the particular first terminal, providing on the other side of said elongate region of said chip second individual terminals for the electrodes in each second electrode array, spacing any second individual terminal of any one of the electrodes in any one of said second electrode arrays from the second individual terminal of any other electrode in the particular second electrode array by a center-to-center distance greater than the center-to-center spacing between the latter one electrode and the latter other electrode, while arranging said second individual terminals side by side along the other of said parallel edges to provide each second individual terminal with an individual connecting lead path being free of any other terminal and intersecting a plane through the other of said parallel edges for connection of a lead to the particular second individual terminal, providing all individual first terminals and all individual second terminals for all of said complete first and second electrode arrays of each chip on the same chip, and arranging the chips side by side into an elongate light gate structure, with any two adjacent chips having a said first side of one of these two chips placed in abutment with a said second side of the other of these two chips. According to this aspect of the invention, the method herein defined includes the steps of providing a first one of said electrodes in each chip along and coincident with said first side of the particular chip, and a second one of said electrodes in the particular chip along and coincident with said second side of the particular chip, and arranging said chips side by side into an elongate light gate structure, with any two adjacent chips having a said first electrode of one of these two chips placed in abutment with a said second electrode of the other of these two chips.

From another aspect thereof, the subject invention resides in a method of composing an elongate light gate structure of a plurality of individual chips of electrooptically active light gate material displaying field induced birefringence. More specifically, the invention according to this aspect resides in the improvement comprising in combination the steps of providing said chips in rectangular configuration having parallel first and second sides and parallel edges extending between said sides, providing on each chip a plurality of interdigitated first and second electrodes delimiting elongate light gate regions and extending parallel to said first and second sides of the rectangular configuration, subdividing the spaced parallel interdigitated first and second electrodes on each chip into complete first and second electrode arrays alternating with each other along an elongate region of said chip, allocating to each of said electrode arrays a plurality of said first electrodes and a plurality of said second electrodes, providing for each plurality of first electrodes in each first electrode array on said chip a first common electrode located at a first side of said elongate region, providing for each plurality of first electrodes in each second electrode array on said chip a second common electrode located at an opposite second side of said elongate region, providing terminal means for said first and second common electrodes on said chip, providing on said second side of said elongate region of said chip first individual terminals for the second electrodes in each first electrode array, spacing any first individual terminal of any one of the second electrodes in any of said first electrode arrays from the first individual terminal of any other second electrode in the particular first electrode array by a center-to-center distance greater than the center-to-center spacing between said one second electrode and said other second electrode, while arranging said first individual terminals side by side along one of said parallel edges to provide each first individual terminal with an individual connecting lead path being free of any other terminal and intersecting a plane through said one of said parallel edges for connection of a lead to the particular first terminal, providing on said first side of the elongate region of said chip second individual terminals for the second electrodes in each second electrode array, spacing any second individual terminal of any one of the second electrodes in any one of said second electrode arrays from the second individual terminal of any other second electrode in the particular second electrode array by a center-to-center distance greater than the center-to-center spacing between the latter one second electrode and the latter other second electrode, while arranging said second individual terminals side by side along the other of said parallel edges to provide each second individual terminal with an individual connecting lead path being free of any other terminal and intersecting a plane through said other of said parallel edges for connection of a lead to the particular second individual terminal, providing all individual first terminals and all individual second terminals for all of said second electrodes in said first and second electrode arrays of each chip on that same chip, and arranging said chips side by side into an elongate light gate structure, with any two adjacent chips having a said first side of one of these two chips placed in abutment with a said second side of the other of these two chips. According to this aspect of the invention, the method herein defined includes the step of providing a first one of said first electrodes in each chip along and coincident with said first side of the particular chip, and a second one of said first electrodes in the particular chip along and coincident with said second side of the particular chip, and arranging said chips side by side into an elongate light gate structure, with any two adjacent chips having a said first one of said first electrodes of one of these two chips placed in abutment with a said second one of said first electrodes of the other of these two chips.

From another aspect thereof, the subject invention resides in a method of composing an elongate light gate structure of a plurality of individual chips including electrooptically active light gate material displaying field induced birefringence. More specifically, the invention according to this aspect resides in the improvement comprising in combination the steps of providing said chips in rectangular configuration, providing on each chip a plurality of interdigitated first and second electrodes defining elongate light gate regions and extending parallel to opposite first and second sides of the rectangular configuration, and a serpentine common electrode for said second electrodes having a first branch extending along and coincident with said first side, and a second branch extending along and coincident with said second side, and arranging said chips side by side into an elongate light gate structure having an overall serpentine common electrode formed of the serpentine common electrodes of the arranged chips, including said first branch on a first chip of any two adjacent chips abutting a said second branch on the second chip of these two adjacent chips.

From another aspect thereof, the subject invention resides in a method of providing an elongate light gate structure of a plurality of individual chips including electrooptically active light gate material displaying field induced birefrincence. More specifically, the invention according to this aspect resides in the improvement comprising in combination the steps of providing said chips in rectangular configuration, providing on each chip a plurality of alternating electrodes and elongate light gate regions extending parallel to opposite sides of the rectangular chip, providing a rigid beam with a pair of spaced parallel elongate mounting surface and an elongate opening located between and extending along said mounting surfaces, and mounting said chips side by side on said pair of mounting surfaces, with said light gate regions registering with said opening.

From another aspect thereof, the subject invention resides in an electrooptical gating method and, more, specifically, in the improvement comprising in combination the steps of providing a chip including electrooptically active light gate material displaying field induced and photoinduced birefringence, providing on said chip a plurality of alternating electrodes and elongate light gate regions by spacing said electrodes from each other by an interelectrode distance smaller than one-half the thickness of said electrooptically active light gate material and by distributing said electrodes over only one side of said light gate material, electrically driving said light gate regions via said electrodes, and minimizing photoinduced birefringence by shining light through said driven light gate regions from a side of said light gate material located opposite said one side.

From another aspect thereof, the subject invention resides in a method of interfacing a circuit board having first terminals at an edge portion with an adjacent structure having a substrate and second terminals in the vicinity of said first terminals. More specifically, the invention according to this aspect resides in the improvement comprising in combination the steps of mounting said circuit board at a first region spaced from said edge portion for pivotal movement relative to a plane extending parallel to said substrate, exerting forces on said circuit board at a second region nearer to said substrate than said first region, effecting pivotal movement of said circuit board and leveling said edge portion relative to said substrate with said forces, and retaining said circuit board stationary relative to said substrate upon leveling of said edge portion.

From another aspect thereof, the subject invention resides in a method of preparing chips of electrooptically active light gate material displaying field induced birefringence, for arrangement in an elongate light gate structure. More specifically, the invention according to this aspect resides in the improvement comprising in combination the steps of providing said chips in rectangular configuration, providing on each chip a plurality of interdigitated first and second electrodes defining elongate light gate regions and extending parallel to opposite first and second sides of the rectangular configuration, and a serpentine common electrode for said second electrodes having a first branch extending along and coincident with said first side, and a second branch extending along and coincident with said second side, so that a said first branch of one chip of any two adjacent chips in said elongate light gate structure and a said second branch of the other chip of said two adjacent chips form part of an overall serpentine common electrode formed of the serpentine common electrodes of said chips including said first branch on said one chip of said two adjacent chips abutting a said second branch on said other chip of said two adjacent chips when arranged side by side in said elongate light gate structure.

From another aspect thereof, the subject invention resides in an elongate light gate structure comprising, in combination, a plurality of individual rectangular chips of electrooptically active light gate material displaying field induced birefringence and having parallel first and second sides and parallel edges extending between said sides, a plurality of alternating electrodes and elongate light gate regions on each chip extending parallel to said first and second sides of the particular rectangular chip, with said electrodes being subdivided on said chip into complete first and second electrode arrays alternating with each other along an elongate region of said chip and each of said first and second electrode arrays including a plurality of said electrodes, means for individually connecting the electrodes in each first electrode array to circuitry along individual connecting lead paths intersecting a plane through one of said parallel edges, including first individual terminals for the electrodes in each first electrode array arranged side by side on one side of said elongate region of said chip along said one parallel edge, whereby each first individual terminal has an individual connecting lead path to said one parallel edge free of any other terminal, with any first individual terminal of any one of the electrodes in any of said first electrode arrays being spaced from the first individual terminal of any other electrode in the particular first electrode array by a center-to-center distance greater than the center-to-center spacing between said one electrode and said adjacent electrode, and means for individually connecting the electrodes in each second electrode array to circuitry along individual connecting lead paths intersecting a plane through the other of said parallel edges, including second individual terminals for the electrodes in each second electrode array array arranged side by side on the other side of said elongate region of said chip along said other parallel edge, whereby each second individual terminal has an individual connecting lead path to said other parallel edge free of any other terminal, with any second individual terminal of any one of the electrodes in any of said second electrode arrays being spaced from the individual terminal of any other electrode in the particular second electrode array by a center-to-center distance greater than the center-to-center spacing between the latter one electrode and the latter other electrode, all individual first terminals and all individual second terminals for all of said complete first and second electrode arrays of each chip being present on that same chip, and means for providing an elongate light gate structure wherein electrodes and elongate light gate regions alternate along said plurality of individual rectangular chips, including means for mounting said chips side by side, with any two adjacent chips having a said first side of one of these two chips in abutment with said second side of the other of these two chips. According to this aspect of the invention, the light gate structure herein defined includes the features of a first one of said electrodes in each chip extending along and coincident with said first side, and a second one of said electrodes in the particular chip extending along and coincident with said second side of the particular chip, and said mounting means including means for situating a said first side with a said first electrode of one of any two adjacent chips in abutment with a said second side and a said second electrode of the other of these two chips.

From another aspect thereof, the subject invention resides in an elongate light gate structure comprising, in combination, a plurality of individual rectangular chips of electrooptically active light gate material displaying field induced birefringence and having parallel first and second sides and parallel edges extending between said sides, complete first and second electrode arrays alternating with each other along an elongate region of each chip between said spaced parallel edges, each first electrode array having a plurality of first electrodes and a plurality of second electrodes, with said first and second electrodes of each first electrode array being parallel to, and spaced from, each other and interdigitated along part of said elongate region, a first common electrode for the first electrodes in each first electrode array, located at a first side of said elongate region, means for individually connecting the second electrodes in each first electrode array to circuitry along individual connecting lead paths intersecting a plane through one of said parallel edges, including first individual terminals for the second electrodes in each first electrode array arranged side by side on an opposite second side of said elongate region of said chip along said one parallel edge, whereby each first individual terminal has an individual connecting lead path to said one parallel edge free of any other terminal, with any first individual terminal of any one of the second electrodes in any of said first electrode arrays being spaced from the first individual terminal of any other second electrode in the particular first electrode array by a center-to-center distance greater than the center-to-center spacing between said one second electrode and said adjacent second electrode, and each second electrode array having a plurality of first electrodes and a plurality of second electrodes, with the latter first and second electrodes of each second electrode array being parallel to, and spaced from, each other and interdigitated along part of said elongate region, a second common electrode for the first electrodes in each second electrode array, located at said second side of said elongate region, terminal means for said first and second common electrodes, means for individually connecting the second electrodes in each second electrode array to circuitry along individual connecting lead paths intersecting a plane through the other of said parallel edges, including second individual terminals for the second electrodes in each second electrode array arranged side by side on said first side of said elongate region of said chip along said other parallel edge, whereby each second individual terminals has an individual connecting lead path to said other parallel edge free of any other terminal, with any second individual terminal of any one of the second electrodes in any of said second electrode arrays being spaced from the individual terminal of any other second electrode in the particular second electrode array by a center-to-center distance greater than the center-to-center spacing between the latter one second electrode and the latter other second electrode, all individual first terminals and all individual second terminals for all of said complete first and second electrode arrays of each chip being present on that same chip, and means for providing an elongate light gate structure wherein electrodes and elongate light gate regions alternate along said plurality of individual rectangular chips, including means for mounting said chips side by side, with any two adjacent chips having a said first side of one of these two chips in abutment with a said second side of the other of these two chips. According to this aspect of the invention, the light gate structure herein defined includes the features of a first one of said first electrodes in each chip extending along and coincident with said first side of the particular chip, and a second one of said first electrodes in the particular chip extending along and coincident with said second side of the particular chip, and said means for mounting said chips side by side arranging said chips into an elongate light gate structure, with any two adjacent chips having a said first one of said first electrodes of one of these two chips placed in abutment with a said second one of said first electrodes of the other of these two chips.

From another aspect thereof, the subject invention resides in an elongate light gate structure comprising, in combination, a plurality of individual rectangular chips of electrooptically active light gate material displaying field induced birefringence, a plurality of interdigitated first and second electrodes on each chip defining elongate light gate regions and extending parallel to opposite first and second sides of the particular rectangular chip, and a serpentine common electrode for said second electrodes having a first branch extending along and coincident with said first side, and a second branch extending along and coincident with said second side, and means for providing an elongate light gate structure having an overall serpentine common electrode formed of the serpentine common electrodes of the individual chips, including means for mounting said chips side by side, with a said first branch on a first chip of any two adjacent mounted chips abutting a said second branch on the second chip of these two adjacent mounted chips.

From another aspect thereof, the subject invention resides in an elongate light gate structure comprising, in combination, a plurality of individual rectangular chips of electrooptically active light gate material displaying field induced birefringence, a plurality of alternating electrodes and elongate light gate regions on each chip extending parallel to opposite sides of the rectangular chip, a rigid beam having a pair of spaced parallel elongate mounting surfaces and an elongate opening located between and extending along said mounting surfaces, and means connected to said rigid beam for mounting said chips side by side on said pair of mounting surfaces, with said light gate regions registering with said opening.

From another aspect thereof, the subject invention resides in apparatus for electrooptically gating light and, more specifically, resides in the improvement comprising, in combination, a chip including electrooptically active light gate material displaying field induced and photoinduced birefringence and having a plurality of alternating electrodes and elongate light gate regions, said electrodes having interelectrode spacings from each other smaller than one-half the thickness of said electrooptically active light gate material, and said electrodes being present on only one side of said light gate material, means connected to said electrodes for electrically driving said light gate regions, and means for minimizing photoinduced birefringence by shining said light through said driven light gate regions from a side of said light gate material located opposite said one side.

From another aspect thereof, the subject invention resides in apparatus for interfacing a circuit board having first terminals at an edge portion with a structure having a substrate and second terminals corresponding to said first terminals. More specifically, the invention according to this aspect resides in the improvement comprising, in combination, first means for mounting said circuit board at a first region spaced from said edge portion for pivotal movement relative to a plane extending parallel to said substrate and for locating said edge portion in the vicinity of said substrate, and second means coupled to said circuit board at a second region nearer to said substrate than said first region for effecting pivotal movement of said circuit board and leveling of said edge portion relative to said substrate, and for retaining said circuit board stationary relative to said substrate upon leveling of said edge portion.

From another aspect thereof, the subject invention resides in a chip of electrooptically active light gate material displaying field induced birefringence, for assembly with other like chips in an elongate light gate structure comprising, in combination, a plurality of interdigated first and second electrodes on said chip defining elongate light gate regions and extending parallel to opposite first and second sides of the particular rectangular chip, and a serpentine common electrode for said second electrodes having a first branch extending along and coincident with said first side, and a second branch extending along and coincident with said second side, so that a said first branch of said chip and a said second branch of a said other like chip form part of an overall serpentine common electrode formed of the serpentine common electrodes of said chip and said other like chips including said first branch and including said second branch of said other like chip when arranged side by side in said elongate light gate structure.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which.

DESCRIPTION OF PREFERRED EMBODIMENTS

Figure 1:
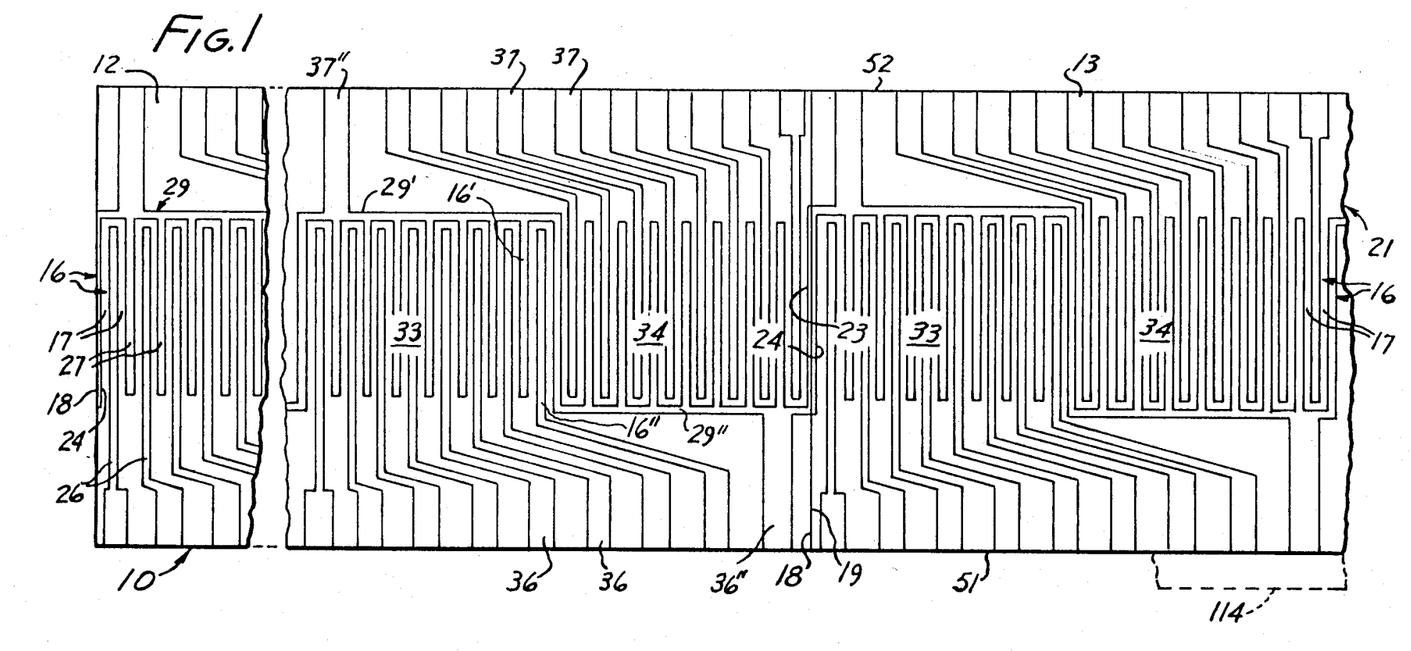
FIG. 1 is a foreshortened top view of a fraction of a light gate structure composed according to a preferred embodiment of the subject invention.
Figure 2:
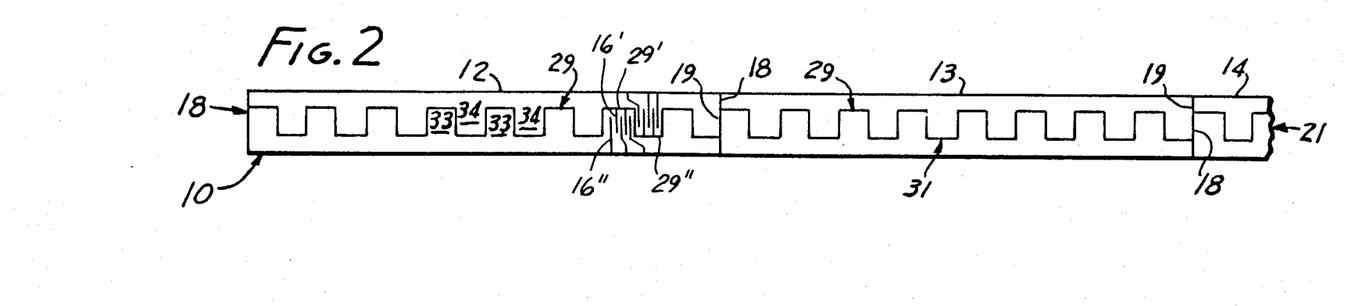
FIG. 2 is a diagrammatic view on a smaller scale showing a greater length of the light gate structure partially shown in FIG. 1.

The electrode structure 10 shown in FIGS. 1 and 2 according to the subject invention is composed of a plurality of individual chips 12, 13, 14, etc., of electrooptically active light gate material displaying field induced birefringence. As seen in FIGS. 1 and 2, these chips are provided in rectangular configuration.

On each chip there is provided a plurality of alternating electrodes 16 and elongate light gate regions 17 extending in parallel to opposite first and second sides of the rectangular configuration of the particular chips 12, 13, 14, etc.

In accordance with the preferred embodiment of the subject invention shown in FIG. 1, a first one of the electrodes 16 extends along and is coincident with the first side 18, and a second one of these electrodes extends along and coincident with the second side 19 of the particular chip.

As shown in FIG. 1 and as particularly seen in FIG. 2, the chips 12, 13, 14, etc. are arranged side by side into an elongate light gate structure 21. In particular, any two adjacent chips, such as the chips 12 and 13, have a first electrode 23 of the electrodes 16 of one of these two chips, such as the chip 12 placed in abutment with a second electrode 24 of the electrodes 16 of the other of these two chips, such as the chip 13.

In accordance with a preferred embodiment of the subject invention, each of the first and second electrodes 23 and 24 is provided with a width smaller than the width of any electrode of the remainder of the electrodes 16.

Preferably, each of the first and second electrodes 23 and 24 is provided with a width equal to one-half the width of the remainder of the electrodes 16. In this manner, an electrode composed of electrode halves 23 and 24 extends over the abutment of adjacent chips 12 and 13 and has a width and configuration which is indistinguishable for the optical recording or other equipment utilizing the light gate structure 21.

As seen in FIG. 1, the electrodes 16 may in effect comprise interdigitated first and second electrodes 26 and 27 defining the elongate light gate regions 17 and extending parallel to the opposite first and second sides 18 and 19 of the rectangular chip configuration. A serpentine common electrode 29 may also be provided on each chip. This serpentine electrode 29 is common to the second electrodes 27 and has a first branch 24 extending along and coincident with the first side 18, and a second branch 23 extending along and coincident with the second side 19 of the particular chip. The same applies to the other chips, such as the chip 13 which at 24 shows a first branch of a serpentine common electrode 29 extending along and in coincidence with the first side 18 of the rectangular chip 13.

As shown in FIG. 2, when the chips 12, 13, 14, etc. are arranged side by side into an elongate light gate structure, such structure 21 in effect has an overall serpentine common electrode 31 formed of the serpentine common electrodes 29 of the arranged chips 12, 13, 14, etc., including the first branch 24 on a first chip, such as the chip 13, of any two adjacent mounted chips abutting a second branch 23 on the second chip, such as the chip 12 shown in FIG. 1, of these two adjacent mounted chips.

In accordance with a preferred embodiment of the subject invention, each of the first and second branches of the common electrodes 29 at 23 and 24 is provided with a width smaller than the width of any second electrode 27 located between first electrodes 26 on the chip 12, 13 or 14. Preferably, each of the first and second common electrode branches at 23 and 24 has a width equal to one-half the width of any second electrode 27 located between first electrodes 26 on the chip 12, 13 or 14. In this manner, the continuity of the serpentine common electrode 31 extends not only over each chip, but also from chip to chip.

The electrodes in the light gate structure of FIG. 1 are arranged or grouped into first and second arrays 33 and 34 alternating with each other along the length of the electrode structure 21. In FIG. 2, the individual electrodes have not been shown to avoid crowding of the figure, except that a few electrodes have been diagrammatically indicated for better understanding. It is, however, understood that the electrode arrays 33 and 34 are, of course, also present in the assembled light gate structure 21 of FIG. 2.

In both FIGS. 1 and 2, the illustrated arrangement of the electrodes in alternating first and second electrode arrays permits the electrode terminals or pads 36 and 37 to be spread out, preferably along the margins of the elongate light gate structure. In this manner, the center-to-center spacing between each adjacent pairs of terminals 36 or 37 is greater than the center-to-center spacing between the electrodes to which the particular terminals are connected. Also, the terminals 36 are mutually aligned in parallel to the adjacent light gate structure edge, and the terminals 37 are mutually aligned in parallel to their adjacent substrate edge.

In this manner, the electrodes can be connected to their driving circuitry without crossovers among adjacent leads.

FIGS. 1 and 2 represent what may be termed a dual aperture gate structure (see the above mentioned WESCON publication, p. 9). An embodiment of the subject invention in terms of a single aperture gate structure is shown in FIGS. 3 to 5.

Figures 3, 5:
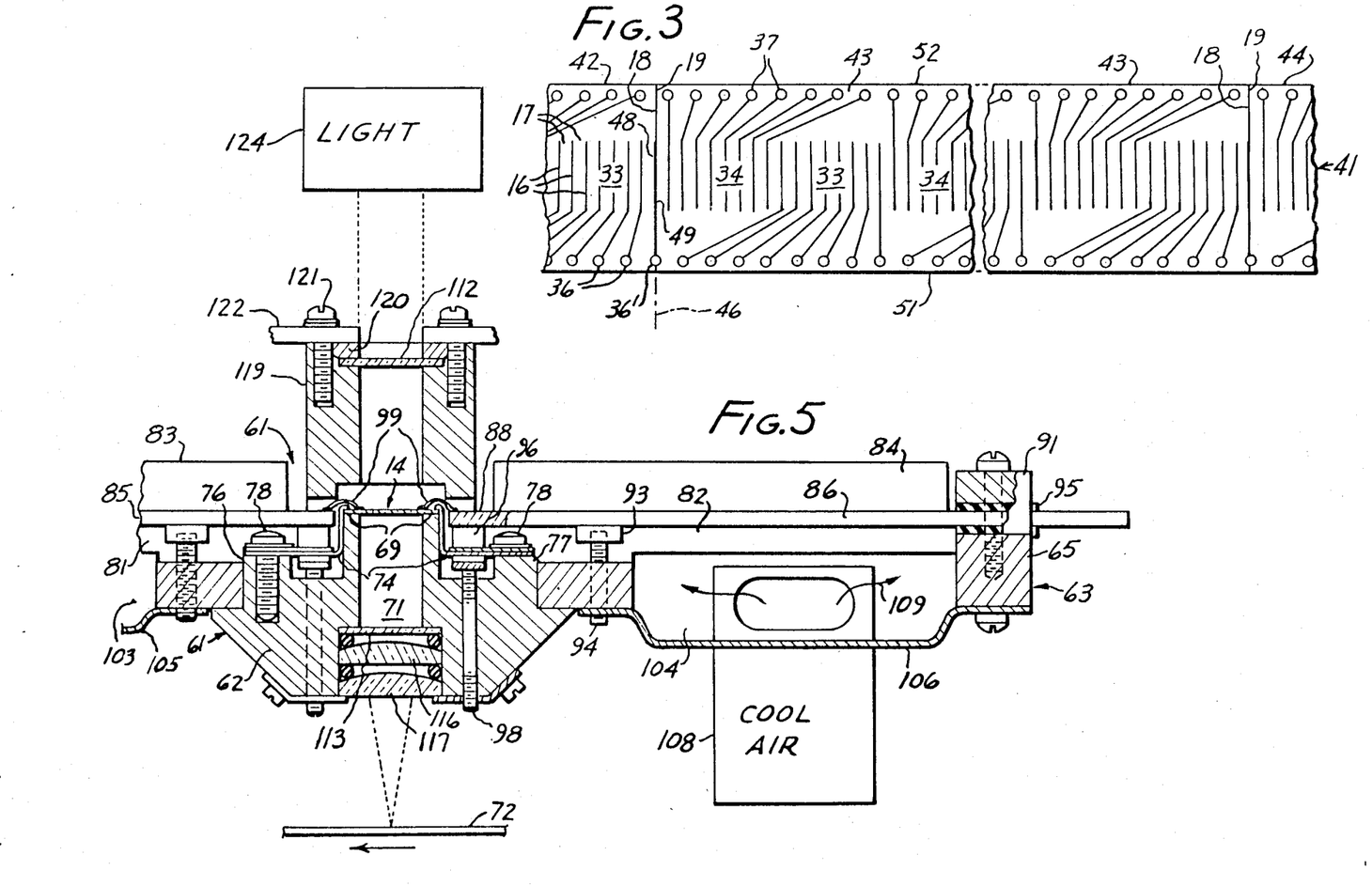
FIG. 3 is a foreshortened view of a fraction of a light gate structure composed according to a further preferred embodiment of the subject invention.
FIG. 5 is a section, partially broken off, taken on the stepped line 55 in FIG. 4.
Figure 4:
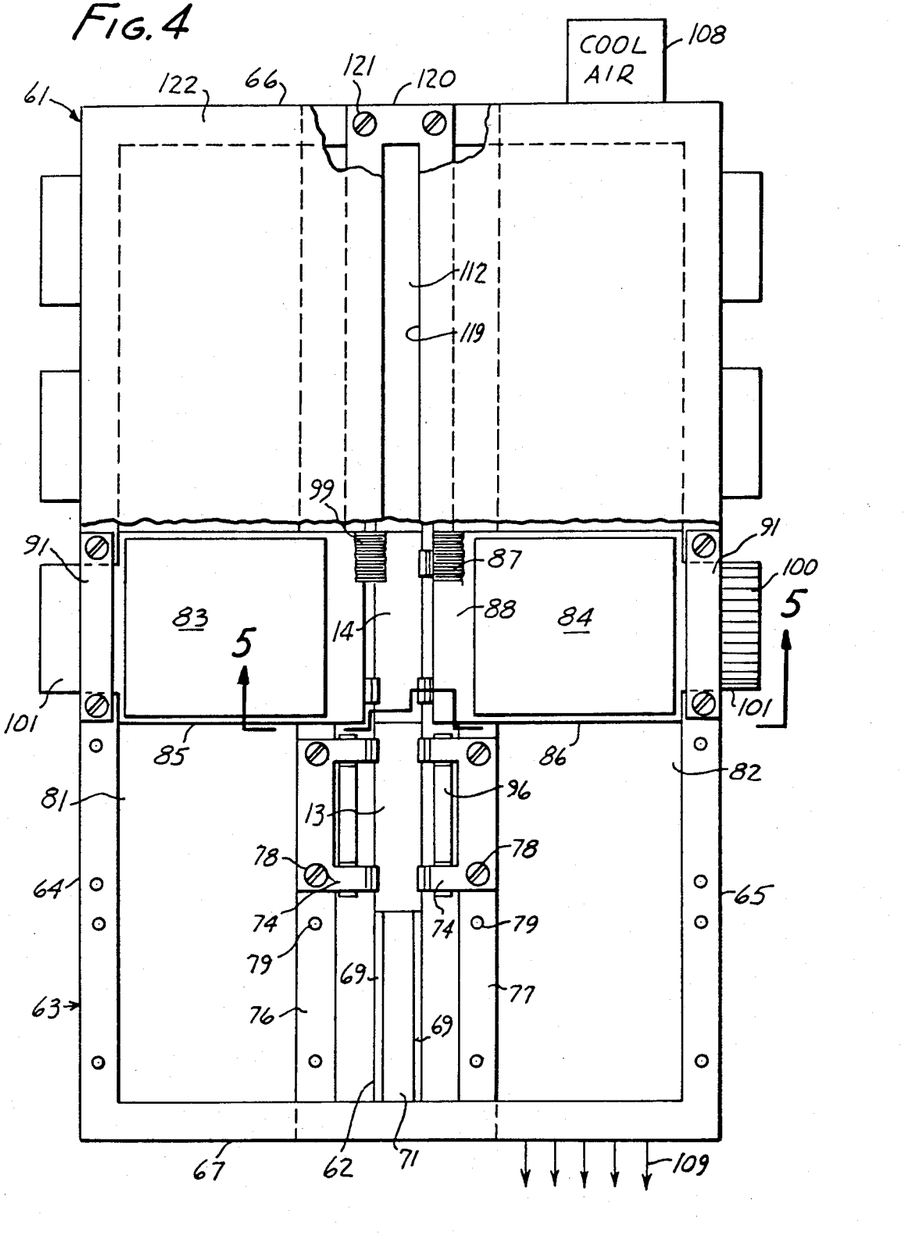
FIG. 4 is a top view of a light gate structure according to a preferred embodiment of the subject invention.

Pursuant to FIG. 3, a partially illustrated elongate light gate structure 41, which corresponds to the assembled light gate structure 21 of FIG. 2, is composed of rectangular individual substrates or chips 42, 43, 44, etc., arranged side by side in mutual abutment. The chips 42, 43, 44, etc., like the chips 12, 13, 14, etc. are made of or comprise electrooptically active light gate material, such as a ferroelectric ceramic of the above mentioned PLZT type.

Again, each chip has a plurality of alternating electrodes 16 and elongate light gate regions 17 extending parallel to opposite first and second sides 18 and 19 of the rectangular configuration.

The electrodes are again arranged in alternating first and second arrays, with the electrodes in the first arrays having terminals 36 and the electrodes in the second arrays terminals 37 mutually spaced and arranged similar to the electrode terminals shown in FIG. 1.

According to the preferred embodiment shown in FIG. 3, a first electrode 48 of the electrodes 16 on the chip 42 extends along and is coincident with the first chip side 18. This electrode arrangement is repeated at the first side 18 of each chip. Similarly, the chip 43 has a second electrode 49 extending along and coincident with the second side 19 of that chip. This electrode configuration also is repeated at each second chip side.

As shown in FIG. 3, the individual chips are arranged side by side into an elongate light gate structure 41 with, as shown in more detail at 46, any two adjacent chips, such as the chips 42 and 43, having a first electrode 48 of one of the two chips placed in abutment with a second electrode 49 of the other of these two chips.

In this manner, any recording or other light sensitive equipment associated with the light gate structure is incapable of perceiving any gap or discontinuity between the abutting chip sides 18 and 19.

Again, each of the first and second electrodes 48 and 49 is provided with a width smaller than the width of any electrode 16 of the remaining electrodes on the particular chip. Preferably, each of the first and second electrodes 48 and 49 is provided with or has a width equal to one-half the width of the remainder of the electrodes 16. In this manner, the composite electrode formed at the abutting sides 18 and 19 of the first and second electrodes 48 and 49 has the same width as any other electrode 16 aiding in driving a light gate region. As shown at 36' in FIG. 3, the terminal or pad for the combined electrodes 48/49 may be composed of two halves or other parts situated at different sides of the interface of the chip sides 18 and 19.

The embodiments of FIGS. 1 to 3 obey the same principles of the subject invention.

In particular, each of the chips 12, 13, 14, 42, 43, 44, etc. has a rectangular configuration including parallel first and second sides 18 and 19 and parallel edges 51 and 52 extending between these sides. On each chip there are provided a plurality of alternating electrodes 16 and elongate light gate regions 17 extending parallel to the first and second sides 18 and 19 of the rectangular configuration. The spaced parallel electrodes on each chip 12, 13, 14, 42, 43, 44 are subdivided into complete first and second electrode arrays 33 and 34 alternating with each other along an elongate region of that chip. To each of the electrode arrays 33 and 34 there are allocated a plurality of the electrodes 16. On one side of the latter elongate region of the chip, first individual terminals 36 for the electrodes in each first electrode array are provided. Any such first individual terminal 36 of any one of the electrodes in any of the first electrode arrays 33 is spaced from the first individual terminal of any other electrode in the particular first electrode array by a center-to-center distance greater than the center-to-center spacing between said one electrode and said other electrode. These first individual terminals 36 are arranged side by side along one of said parallel edges 51 and 52 to provide each first individual terminal with an individual connecting lead path being free of any other terminal and intersecting a plane through one edge 51 of the parallel edges 51 and 52, for connection of a lead to the particular first terminal. On the other side of the elongate region of the chip, second individual terminals 37 for the electrodes in each second electrode array 34 are provided. Any second individual terminal 37 of any one of the electrodes in any one of the second electrode arrays is spaced from the second individual terminal of any other electrode in the particular second electrode array by a center-to-center distance greater than the center-to-center spacing between the latter one electrode and the latter other electrode. The second individual terminals 37 extend side by side along the other edge 52 of the parallel edges 51 and 52 to provide each second individual terminal with an individual connecting lead path being free of any other terminal and intersecting a plane through the other of said parallel edges for connection of a lead to the particular second individual terminal.

According to an important feature of the currently discussed aspect of the subject invention, all individual first terminals 36 and all individual second terminals 37 for all of the complete first and second electrode arrays 33 and 34 of each chip are located or present on that same chip. In this manner, there is no crossover of electrode connecting leads among the various chips.

The chips 12, 13, 14, 42, 43, 44, etc. are arranged side by side into an elongate light gate structure 21 or 41, with any two adjacent chips having a first side 18 of one of these two chips placed in abutment with a second side 19 of the other of these two chips.

FIG. 3 illustrates what may be termed a single aperture gate structure, while FIG. 1 depicts a dual aperture gate structure. According to FIG. 1, there is provided on each chip 12 and 13 a plurality of interdigitated first and second electrodes 16' and 16" delimiting elongate light gate regions 17 and extending parallel to the first and second sides 18 and 19 of the rectangular chip configuration. The spaced parallel interdigitated first and second electrodes on each chip are subdivided into complete first and second electrode arrays 33 and 34 alternating with each other along an elongate region of the chip. There are allocated to each of these electrode arrays a plurality of first electrodes 16' and a plurality of second electrodes 16". For each plurality of first electrodes in each first electrode array 33 on the chip 12, 13 or 14 there is provided a first common electrode 29' located at a first side of the elongate region. For each plurality of first electrodes in each second electrode array 34 on the chip there is provided a second common electrode 29" located at an opposite second side of the elongate region on which the arrays 33 and 34 extend. Terminals 36" and 37" are provided for the latter common electrodes on the mentioned second side of the elongate region of the chip. First individual terminals 36 for the second electrodes 16" in each first electrode array 33 are provided. Similarly, second individual terminals 37 for the second electrodes 16" in each second electrode array 34 are provided on the mentioned first side of the elongate region. The above mentioned features concerning the increased center-to-center distance between any two adjacent individual terminals 36 or 37 is also realized in the dual aperture gate region of FIG. 1.

In mounting and operating the composite electrode structures herein disclosed, it is very important that the electrode chips remain in mutual alignment and abutment to avoid any separation or other disturbance among the individual chips that could be discerned by the optical recording or other equipment associated with the composite light gate structures.

A light gate structure or assembly 61 for realizing these desiderata according to a preferred embodiment of the subject invention is shown in FIGS. 4 and 5.

In particular the assembly 61 has a rigid beam 62 mounted in or forming part of a frame 63. This frame is rectangular in outline, having side members 64 and 65 and end members 66 and 67. The lateral members 64 and 65 extend parallel to the elongate beam 62, having that beam extend therebetween in mutual relationship thereto. The end members 66 and 67 extend at right angles to the beam 62 and side members 64 and 65.

The beam 62 has or is provided with a pair of spaced parallel elongate mounting surfaces 69 and an elongate opening 71 located between and extending along these mounting surfaces.

The chips 12, 13, 14 or 42, 43, 44, etc., are mounted side by side on the pair of mounting surfaces 69, with the light gate region of the chips registering with the beam opening 71.

Preferably, and pursuant to the above mentioned preferred embodiment of the subject invention, the chips are assembled to a light gate structure 21 or 41, presenting to the source of illumination and to the recording medium 72 uniformly spaced electrodes and uniformly dimensioned light gates or light gate regions 17 distributed along the rigid beam 62.

Practical electrooptical ceramic chips or other light gate materials which have become known so far are very strain and temperature sensitive, being particularly vulnerable to strain bias affecting the rotation of the polarization vector of the light impinging upon or transmitted through the electrooptically active material. This, in practice, would eventuate in false readings and in a general performance degradation and quality limitation.

The illustrated preferred embodiment of the subject invention successfully overcomes such drawbacks and limitations by providing and employing chip mounting clips 74 for mounting the chips side by side on the pair of mounting surfaces 69.

The chip mounting clips 74 ideally minimize the effect of differential thermal expansion between the chips and the mounting beam 62 and also permit dimensional changes due to piezoelectric effects in the electrooptically active material.

The beam 62 has a pair of rails or elongate mounting pads 76 and 77 on which the clips 74 are mounted by means of screws 78 sitting in threaded bores 79. The chips 74 ideally retain the chips in a near floating condition on the rigid beam 62, with sufficient retentivity to enable use of bonding techniques for connection of leads to the substrate terminals. As seen in FIG. 5, the chip mounting clips 74 are engageable with the chips 12, 13, 14, etc., and the chips are retained on the rigid beam 62 or mounting surfaces 69 with the clips in engagement with such chips.

As seen in FIGS. 4 and 5, the frame 63 in effect provides the beam 62 with first and second lateral extensions 81 and 82 adjacent one and the other of the mounting surfaces 69. The electrode array or light gate 17 are driven by means including hybrid or other electronic circuitry 83 and 84 located on first and second circuit boards 85 and 86 which, in turn, are mounted on the first and second extension or frame sections 81 and 82, respectively.

Each circuit board 85 and 86 has first terminals 87 at an edge portion 88 thereof. Only a few of the terminals 87 have been shown in FIG. 4 to avoid obscuration of the drawing.

In this context, the terminals 38 and 37 of the chips (see FIGS. 1 and 3) may be viewed as second terminals corresponding to the first terminal 87 of the circuit boards.

To provide for a proper interfacing of the circuit boards with adjacent structure having a substrate or chips and the mentioned second terminals 36 or 37 in the vicinity of the first terminals 87, the illustrated embodiment of the subject invention has for each circuit board a mounting bracket 91 attached to the lateral frame member 64 or 65 for mounting the particular circuit board at a first region spaced from the edge portion 88 for pivotal movement relative to a plane extending parallel to the adjacent substrate or chip (e.g. 14). The bracket 91 and frame member 64 or 65 cooperate in locating the edge portion 88 of a given chip in the vicinity of the substrate or light gate chip.

If the bracket 91 is considered as part of first means, then it may be said that the illustrated preferred embodiment also provides second means coupled to the circuit board 85 or 86 at a second region nearer to the substrate or chip than the first region for effecting pivotal movement of the circuit board and leveling of the edge portion 88 relative to the substrate or chip, and for retaining the circuit board stationary relative to the substrate or chip upon leveling of the edge portion 88. In particular, and as will now be explained with the aid of circuit board 86, each circuit board has a threaded member or bracket 93 depending therefrom or attached thereto. A screw 94 is threaded in a bore in the frame structure 61 and is also threaded in the member 93. Rotation of the screw 94 in a first sense moves the board 86 about the pivot provided at the bracket 91 in a first direction, and rotation of the screw 94 in an opposite sense pivotally moves the board 86 in an opposite second direction. Each circuit board may have elastomeric or other pads 95 applied to both major surfaces thereof at the bracket 91 to facilitate pivotal movement of the board relative to the frame structure or mounted light gate chip.

The illustrated preferred embodiment of the subject invention greatly increases the attainable precision of the circuit board leveling adjustment by providing a movable spacer shoe 96 which has terminal extensions reaching under lateral arms of the chip mounting clips 74. In other words, the clips 74 aid in retaining the spacer shoes 96 in a floating condition. The shoes 96 provide for a support of the edge portion 88, enabling the use of bonding techniques for connecting leads to the terminals 87.

Each spacer shoe 96 is pressed against the circuit board at the latitude of the edge region 88 by one or more set screws 98.

The members 93 and 96 with set screws 94 and 98 exert forces on the circuit board 86 at a second region which is nearer to the substrate or chip 14 than the first region where the bracket 91 is located. In particular, the member 93 and set screw 94, in a particular leveling operation, exerts on the circuit board 86 at a distance from the edge portion 88 or at the above mentioned second region a force for pivoting the circuit board in a first sense, and the spacer shoe 96 and set screw 98 exert on the circuit board 86 at the edge portion 88 a counterforce tending to pivot the circuit board in a second sense opposed to the first sense. Upon proper leveling relative to the substrate or chip 14, the circuit board 86 is retained in its leveled position by joint action of the latter force and counterforce.

The first terminals 87 on the circuit board 86 and the above mentioned second terminals 36 or 37 of the adjacent mounted chip are electrically interconnected upon leveling of the edge portion 88. In practice, such electrical interconnection may be accomplished by running a multitude of thin wires 99 across the gap between each circuit board and its adjacent substrate or chip. Because of the arrangement and increased mutual spacing of terminals 36 and 37 as shown in and disclosed above in connection with FIGS. 1 and 3, the connecting leads do not have to cross over any terminal to which they are not connected and do not have to cross any other lead wires.

Rather, the leads 99 may be installed and may run in mutually parallel relationship. Since the terminals 36 or 37 are spaced from each other at a greater distance than the electrodes 16 to which they are connected, the wires 99 may also be spaced at such greater distance from each other. This in practice facilitates the connection of the leads 99 to their respective terminals 36, 37, 87, minimizes cross talk and shorting between adjacent leads 99, enables attainment of higher resolution of the electrode and light gate structure, and greatly facilitates interfacing of thin film and thick film systems, such as for the chips 12, etc. and the circuit boards 86 etc. The circuit boards, in turn, may be connected to coding or other circuitry via terminals 100 located on projecting portions 101.

During operation of the equipment shown in FIGS. 4 and 5, it is inevitable that the circuits 83 and 84 and possibly other parts of the circuitry develop heat which tends to affect the performance of the light gate structure adversely. In particular, temperature gradients and the temperature exposure itself may subject the chips 12, 13, 14 etc. to strain bias affecting the rotation of the polarization vector of the light impinging upon or transmitted by the chips.

To avoid such detrimental effects, the illustrated preferred embodiment cools the light gate assembly. By way of example, air or another coolant is moved in between the lateral extensions 81 and 82 of the frame 63 and the mounted circuit boards 85 and 86.

In particular, the frame 63 provides a pair of coolant channels 103 and 104 which are covered by removable cowlings or panels 105 and 106 and which may be mirror-image duplicates of each other. A diagrammatically illustrated source of cooling air 108 may include a blower for forcing cooling air through the channel 104 as indicated diagrammatically by arrows 109. In practice, the coolant source 108 may serve both channels 103 and 104, or a separate second source (not shown) may be connected to the channel 103.

The rigid beam 62 retains the chips 12, 13, 14, etc. between the polarizing and analyzing filters 112 and 113 requisite for electrooptical light gate action. In this respect, if the chip mounting clips 74 are of electrically insulating material or are otherwise electrically insulated at least at their tip portions, then the terminals 36 and 37 may extend to the chip edges 51 and 52 as shown in FIG. 1. On the other hand, if the chips 74 engage the chips with a metallic or otherwise electrically conducting portion, then the terminals 36 and 37 are preferably recessed from the chip edges, such as shown in FIG. 3. or indicated in dotted outline at 114 in FIG. 1.

Each of the light filters 112 and 113 is mounted on or relative to the rigid beam 62 and elongate opening 71 in spaced relationship and parallel to the electrooptical chips. In particular, one of the elongate filters 112 and 113 is mounted on the rigid beam 62 at the elongate opening 71 on one side of and parallel to the chips 14 etc., and the other of these two filters is mounted on the opposite side of and parallel to these chips.

Elongate focusing lens means, such as in the form of two elongate cylinder lenses 116 and 117 are mounted on the rigid beam 62 at the elongate opening 71 in spaced relationship and parallel to the chips. By way of example, the cylinder lenses 116 and 117 are mounted in tandem to provide a recording lens system having a short focal length and low aberrations, for projecting the gated light outputs onto the light-sensitive recording medium 72, which is continuously or intermittently transported past the light gate structure.

As seen in FIG. 5, the elongate lenses 116 and 117 may be mounted jointly with the light filter 113 on the rigid beam 62 at the elongate opening 71 in spaced relationship and parallel to the chips 14 etc.

The embodiment shown in FIGS. 4 and 5 provides a mounting frame or housing 119 for the polarizer filter 112. The housing 119 is attached to the frame structure 63 and rises therefrom above the rigid beam 62. The filter 112 is clamped against the housing 119 with the aid of a frame portion 120 and clamping screws 121.

Cowling or cover sheet portions 122 may be attached to the filter mounting housing and frame and may extend over the mounted circuit boards to the edge of the frame structure 63 for a coverage of the equipment against dust and other environmental contaminants.

A source of collimated light 124 is diagrammatically shown in FIG. 5 to illustrate a means for emitting collimated light through the polarizer filter 112 onto the chips or elongate light gate structure for gating via analyzer 113 and lenses 116 and 117 onto the recording medium 72. Examples of collimated light sources may be seen in the above mentioned German Patent Publication by the subject assignee.

Figure 6:
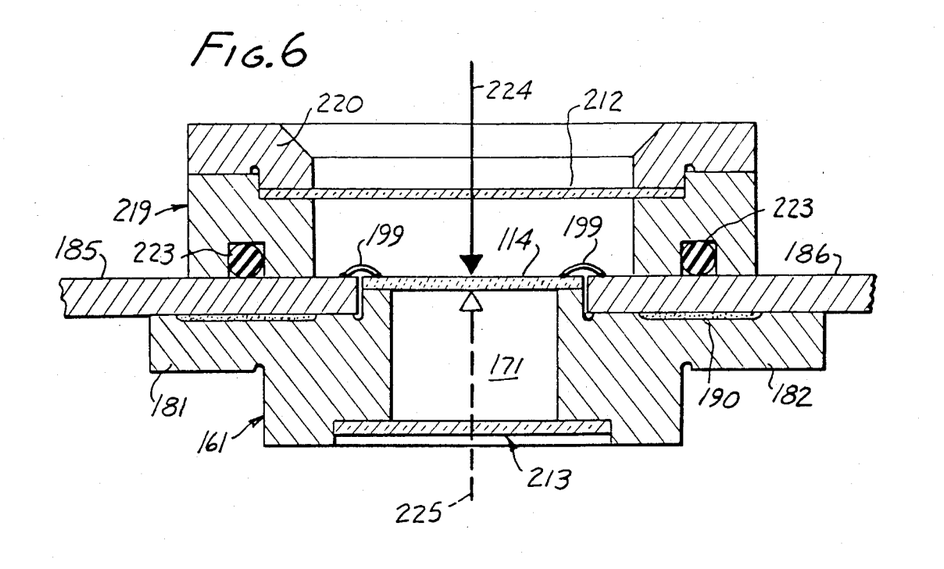
FIG. 6 is a fractional section similar to FIG. 5, illustrating a light gate structure according to a further embodiment of the subject invention.

In practice, the electrooptical chips may be sealed against their environment with the aid of the driver circuit boards and/or with the aid of a filter mounting frame or similar structure. In this respect, FIG. 6 shows part of a light part structure 161 in accordance with a further embodiment of the subject invention. To avoid unnecessary repetition, FIG. 6 employs reference numerals which, for corresponding parts, employ the same reference numerals as FIGS. 4 and 5, except that an amount of 100 has been added in FIG. 6 to each such corresponding reference numerals.

In particular, the rigid beam 161 in FIG. 6 has lateral extensions 181 and 182 to which circuit boards 185 and 186 are, respectively attached, such as by a cement 190. The light gate chip or substrate 114 may be the same as or similar to the chip 14 and may be connected to driving circuitry on the boards 185 and 186 by wires 199 corresponding to the above mentioned wires 99. An analyzing filter 213 may be mounted in spaced relationship to the chip 114 across the beam opening 117.

In FIG. 6, a filter housing and mounting frame structure 219 for the polarizer filter 212 is sealed to the circuit boards 185 and 186 with the aid of elongate gaskets 223. Frame structure similar to the frame 63 shown in FIG. 4 may be employed for mounting the filter mounting frame 219 relative to the rigid beam 116.

The apparatus of FIG. 6 may also include driving circuitry 83 and 84 and focusing lenses 116 and 117 as the equipment of FIG. 4. Also, a collimated light source, such as the source 124 shown in FIG. 5, may be employed for projecting collimated light 224 through the polarizer filter 212 to the chips 114 etc. for selective gating.

As seen in FIG. 6, the circuit boards 185 and 186 correspond with the rigid frame 161 for sealing at least one chip 114 against its environment.

Similarly, the filters 212 and 213, and the filter mounting frame 219, cooperate in sealing the chip 114 or the elongate light structure against its environment.

Within the scope of the subject invention, identical electrodes or electrode patterns may be present on both sides or major surfaces of the chips present on both sides or major surfaces of the chips 12 through 44, etc. However, according to a further preferred embodiment of the subject invention, electrodes are present on only one side of the light gate material or chips. These electrodes are, for instance, driven with circuitry of the type discussed above in connection with the components 83 and 84 shown in FIGS. 4 and 5. According to an important feature of the further embodiment presently under discussion, the illumination of the light gate structure proceeds by shining light through driven light gate region 19 from a side of the light gate material or chip located opposite the mentioned one side on which the electrodes 16 have been provided. This alternative embodiment is illustrated in FIG. 6 by the dotted arrow 225 which shines light through what is now the polarizer filter 213 through the back side of the chip 114.

Figure 7:
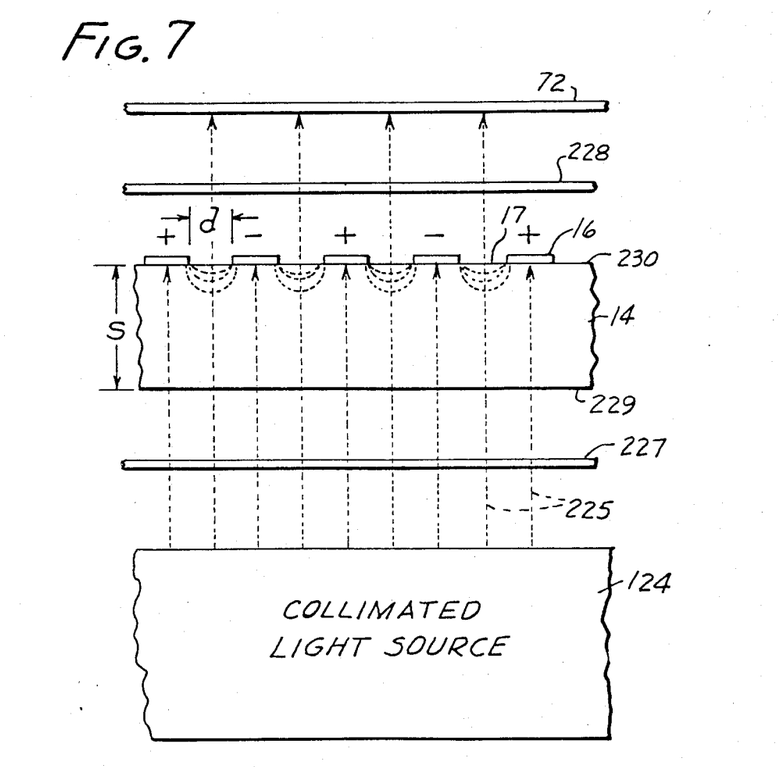
FIG. 7 is a diagrammatic view of an electrooptical light gating system according to a preferred embodiment of the subject invention.

For a further discussion of the latter embodiment, reference may now be had to the diagrammatic showing of FIG. 7.

In particular, FIG. 7 shows how a source 124 of collimated light 225 shines such light through a polarizer filter 227 and back side 229 of a substrate, chip or layer 14 of PLZT or another electrooptically light gate material.

In this respect, the back side 229 is the side of the substrate, chip or layer 14 which is opposite the side 230 on which the electrodes 16 are deposited or over which such electrodes are distributed.

As has been mentioned above in the Disclosure Statement, light gate structures of the type herein mentioned are vulnerable to light induced birefringence in high-intensity electric fields. For large electrode separations, such as interelectrode distances d equal to or larger than the thickness s of the electrooptical layer, chip or substrate 14, the electric field is relatively uniform and the light induced birefringence is relatively insignificant at commonly used driving voltages.

With small interelectrode spacings d required for high resolution, in the range of $d/s < 0.5$, electric field distributions become very non-uniform, resulting in field concentrations close to the edges of the electrodes, which is conducive to generation of charge carriers and space charges acting against the applied electric field when the material 14 is illuminated from and through the side 230 on which the electrodes 16 are located.

By way of example, it has been observed in a case of the latter type that the relative light output of the light gate structure degraded through light induced birefringence to 50% of its original value within four hours of operation and illumination through the top side 230. A degratation to one-third of the original light output of the solid-state light gate structure was observed after seven hours of operation.

On the other hand, the relative light output was at an optimum between one and two hours of operation and never went below 80% of the maximum output within a test period of seven hours, if the substrate 14 was illuminated through the back side 229 as shown in FIG. 7, even though the particular small interelectrode spacing d relative to the layer thickness s concentrated the electric field through the light gate region 17 near the top surface 230, thereby in effect fostering generation of photoinduced charge carriers and resulting space charges. However, since light is shined through the back side 223 according to the illustrated preferred embodiment of the subject invention, two effects cooperate in minimizing photoinduced birefringence.

First, light is absorbed by or in the material of the layer 14 before it will reach the areas of electric field concentration near the top surface 230. Any undesirable photoexcitation is thus reduced by that extent. Also, nothing is lost by such light absorption, since light would be absorbed anyway by the material of the layer 14, whether it proceeds from the surface 229 to the surface 230 as shown in FIG. 7, or from the top surface 230 to the bottom surface 229 when illuminated as indicated by the arrow 224 in FIG. 6.

The preferred embodiment shown in FIG. 7 thus accomplishes a reduction of light induced birefringence at minimum light loss.

Secondly, light from the source 124 entering the layer 14 through the back side 229 illuminates the regions of the layer 14 behind or below the electrodes 16, thereby effectively eliminating charge trap areas and minimizing the buildup of space charges.

As a result, high-density gated light patterns and recordings are obtained. In particular, light gated through the material 14 proceeds via an analyzer filter to a recording medium 72 or other light sensitive system.

It will thus be recognized that the subject invention meets the initially mentioned objectives and satisfies the above mentioned needs.

The subject extensive disclosure will suggest or render apparent to those skilled in the art various modifications and variations within the spirit and scope of the subject invention.

I claim:

1. In a method of composing an elongate light gate structure of a plurality of individual chips of electrooptically active light gate material displaying field induced birefringence, the improvement comprising in combination the steps of:

providing said chips in rectangular configuration having parallel first and second sides and parallel edges extending between said sides;

providing on each chip a plurality of alternating electrodes and elongate light gate regions extending parallel to said first and second sides of the rectangular configuration;

subdividing the spaced parallel electrodes on each chip into complete first and second electrode arrays alternating with each other along an elongate region of said chip;

allocating to each of said electrode arrays a plurality of said electrodes;

providing on one side of said elongate region of said chip first individual terminals for the electrodes in each first electrode array;

spacing any first individual terminal of any one of the electrodes in any of said first electrode arrays from the first individual terminal of any other electrode in the particular first electrode array by a center-to-center distance greater than the center-to-center spacing between said one electrode and said other electrode, while arranging said first individual terminals side by side along one of said parallel edges to provide each first individual terminal with an individual connecting lead path being free of any other terminal and intersecting a plane through said one of said parallel edges for connection of a lead to the particular first terminal;

providing on the other side of said elongate region of said chip second individual terminals for the electrodes in each second electrode array;

spacing any second individual terminal of any one of the electrodes in any one of said second electrode arrays from the second individual terminal of any other electrode in the particular second electrode array by a center-to-center distance greater than the center-to-center spacing between the latter one electrode and the latter other electrode, while arranging said second individual terminals side by side along the other of said parallel edges to provide each second individual terminal with an individual connecting lead path being free of any other terminal and intersecting a plane through the other of said parallel edges for connection of a lead to the particular second individual terminal;

providing all individual first terminals and all individual second terminals for all of said complete first and second electrode arrays of each chip on that same chip;

arranging the chips side by side into an elongate light gate structure, with any two adjacent chips having said first side of one of these two chips placed in abutment with a said second side of the other of these two chips;

providing a first one of said electrodes in each chip along and coincident with said first side of the particular chip, and a second one of said electrodes in the particular chip along and coincident with said second side of the particular chip; and arranging said chips side by side into an elongate light gate structure, with any two adjacent chips having a said first electrode of one of these two chips placed in abutment with a said second electrode of the other of these two chips.

2. A method as claimed in claim 2, wherein: each of said first and second electrodes is provided with a width smaller than the width of any electrode of the remainder of said electrodes.

3. In a method of composing an elongate light gate structure of a plurality of individual chips of electrooptically active light gate material displaying field induced birefringence, the improvement comprising in combination the steps of:

providing said chips in rectangular configuration having parallel first and second sides and parallel edges extending between said sides;

providing on each chip a plurality of interdigitated first and second electrodes delimiting elongate light gate regions and extending parallel to said first and second sides of the rectangular configuration;

subdividing the spaced parallel interdigitated first and second electrodes on each chip into complete first and second electrode arrays alternating with each other along an elongate region of said chip;

allocating to each of said electrode arrays a plurality of said first electrodes and a plurality of said second electrodes;

providing for each plurality of first electrodes in each first electrode array on said chip a first common electrode located at a first side of said elongate region;

providing for each plurality of first electrodes in each second electrode array on said chip a second common electrode located at an opposite second side of said elongate region;

providing terminal means for said first and second common electrodes on said chip;

providing on said second side of said elongate region of said chip first individual terminals for the second electrodes in each first electrode array;

spacing any first individual terminal of any one of the second electrodes in any of said first electrode arrays from the first individual terminal of any other second electrode in the particular first electrode array by a center-to-center distance greater than the center-to-center spacing between said one second electrode and said other second electrode, while arranging said first individual terminals side by side along one of said parallel edges to provide each first individual terminal with an individual connecting lead path being free of any other terminal and intersecting a plane through said one of said parallel edges for connection of a lead to the particular first terminal;

providing on said first side of the elongate region of said chip second individual terminals for the second electrodes in each second electrode array;

spacing any second individual terminal of any one of the second electrodes in any one of said second electrode arrays from the second individual terminal of any other second electrode in the particular second electrode array by a center-to-center distance greater than the center-to-center spacing between the latter one second electrode and the latter other second electrode, while arranging said second individual terminals side by side along the other of said parallel edges to provide each second individual terminal with an individual connecting lead path being free of any other terminal and intersecting a plane through said other of said parallel edges for connection of a lead to the particular second individual terminal;

providing all individual first terminals and all individual second terminals for all of said second electrodes in said first and second electrode arrays of each chip on that same chip;

arranging said chips side by side into an elongate light gate structure, with any two adjacent chips having a said first side of one of these two chips placed in abutment with a said second side of the other of these two chips;

providing a first one of said first electrodes in each chip along and coincident with said first side of the particular chip, and a second one of said first electrodes in the particular chip along and coincident with said second side of the particular chip; and arranging said chips side by side into an elongate light gate structure, with any two adjacent chips having a said first one of said first electrodes of one of these chips placed in abutment with a said second one of said first electrodes of the other of these two chips.

4. In a method of composing an elongate light gate structure of a plurality of individual chips including electrooptically active light gate material displaying field induced birefringence, the improvement comprising in combination the steps of:

providing said chips in rectangular configuration;

providing on each chip on a plurality of interdigitated first and second electrodes defining elongate light gate regions and extending parallel to opposite first and second sides of the rectangular configuration, and a serpentine common electrode for said second electrodes having a first branch extending along and coincident with said first side, and a second branch extending along and coincident with said second side; and arranging said chips side by side into an elongate light gate structure having an overall serpentine common electrode formed of the serpentine common electrodes of the arranged chips, including said first branch on a first chip of any two adjacent chips abutting a said second branch on the second chip of these two adjacent chips.

5. A method as claimed in claim 4, wherein: each of said first and second branches is provided with a width smaller than the width of any second electrode located between first electrodes on said chip.

6. A method as claimed in claim 4, wherein: each of said first and second branches has a width equal to one-half the width of any second electrode located between first electrodes on said chip.

7. A method as claimed in claim 1, 2, 3, 4, 5 or 6, including the steps of:

providing a rigid beam with a pair of spaced parallel elongate mounting surfaces and an elongate opening located between and extending along said mounting surfaces and corresponding in length to said elongate light gate structure; and mounting said chips side by side on said pair of mounting surfaces, with said light gate regions registering with said opening.

8. A method as claimed in claim 7, including the steps of:

providing an elongate filter; and mounting said filter on said rigid beam at said elongate opening in spaced relationship and parallel to said chips.

9. A method as claimed in claim 7, including the steps of:

providing elongate focusing lens means; and mounting said lens means on said rigid beam at said elongate opening in spaced relationship and parallel to said chips.

10. A method as claimed in claim 7, including the steps of:

providing an elongate filter;

providing elongate focusing lens means; and mounting said filter and said lens means on said rigid beam at said elongate opening in spaced relationship and parallel to said chips.

11. A method as claimed in claim 7, including the steps of:

providing elongate first and second filters;

mounting said first filter on said rigid beam at said elongate opening on one side of and parallel to said chips; and mounting said second filter on the opposite side of and parallel to said chips.

12. A method as claimed in claim 1, 2, 3, 4, 5 or 6, including the steps of:

providing a rigid beam with a pair of spaced parallel elongate mounting surfaces and an elongate opening located between and extending along said mounting surfaces and corresponding in length to said elongate light gate structure;

providing a number of chip mounting clips; and mounting said chips with said clips side by side on said pair of mounting surfaces, with said light gate regions registering with said opening.

13. In a method of preparing chips of electrooptically active light gate material displaying field induced birefringence, for arrangement in an elongate light gate structure, the improvement comprising in combination the steps of:

providing said chips in rectangular configuration;

providing on each chip a plurality of interdigitated first and second electrodes defining elongate light gate regions and extending parallel to opposite first and second sides of the rectangular configuration, and a serpentine common electrode for said second electrodes having a first branch extending along and coincident with said first side, and a second branch extending along and coincident with said second side, so that a said first branch of one chip of any two adjacent chips in said elongate light gate structure and a said second branch of the other chip of said two adjacent chips form part of an overall serpentine common electrode formed of the serpentine common electrodes of said chips including said first branch on said one chip of said two adjacent chips abutting a said second branch on said other chip of said two adjacent chips when arranged side by side in said elongate light gate structure.

14. A method as claimed in claim 13, wherein:
each of said first and second branches is provided with a wider smaller than the width of any second electrode located between first electrodes on said chip.

15. A method as claimed in claim 13, wherein:
each of said first and second branches has a width equal to one-half the width of any second electrode located between first electrodes on said chip.

16. An elongate light gate structure comprising in combination:
a plurality of individual rectangular chips of electro-optically active light gate material displaying field induced birefringence and having parallel first and second sides and parallel edges extending between said sides;
a plurality of alternating electrodes and elongate light gate regions on each chip extending parallel to said first and second sides of the particular rectangular chip, with said electrodes being subdivided on said chip into complete first and second electrode arrays alternating with each other along an elongate region of said chip and each of said first and second electrode arrays including a plurality of said electrodes;
means for individually connecting the electrodes in each first electrode array to circuitry along individual connecting lead paths intersecting a plane through one of said parallel edges, including first individual terminals for the electrodes in each first electrode array arranged side by side on one side of said elongate region of said chip along said one parallel edge, whereby each first individual terminal has an individual connecting lead path to said one parallel edge free of any other terminal, with any first individual terminal of any one of the electrodes in any of said first electrode arrays being spaced from the first individual terminal of any other electrode in the particular first electrode array by a center-to-center distance greater than the center-to-center spacing between said one electrode and said adjacent electrode; and
means for individually connecting the electrodes in each second electrode array to circuitry along individual connecting lead paths intersecting a plane through the other of said parallel edges, including second individual terminals for the electrodes in each second electrode array arranged side by side on the other side of said elongate region of said chip along said other parallel edge, whereby each second individual terminal has an individual connecting lead path to said other parallel edge free of any other terminal, with any second individual terminal of any one of the electrodes in any of said second electrode arrays being spaced from the individual terminal of any other electrode in the particular second electrode array by a center-to-center distance greater than the center-to-center spacing between the latter one electrode and the latter other electrode;
all individual first terminals and all individual second terminals for all of said complete first and second electrode arrays of each chip being present on that same chip; and
means for providing an elongate light gate structure wherein electrodes and elongate light gate regions alternate along said plurality of individual rectangular chips, including means for mounting said chips side by side, with any two adjacent chips having a said first side of one of these two chips in abutment with a said second side of the other of these two chips;
a first one of said electrodes in each chip extending along and coincident with said first side, and a second one of said electrodes in the particular chip extending along and coincident with said second side of the particular chip; and
said mounting means including means for situating a said first side with a said first electrode of one of any two adjacent chips in abutment with a said second side and a said second electrode of the other of these two chips.

17. A structure as claimed in claim 16, wherein:
each of said first and second electrodes has a width smaller than the width of any electrode of the remainder of said electrodes.

18. A structure as claimed in claim 16, wherein:
each of said first and second electrodes has a width equal to one-half the width of the remainder of said electrodes.

19. An elongate light gate structure comprising in combination:
a plurality of individual rectangular chips of electro-optically active light gate material displaying field induced birefringence and having parallel first and second sides and parallel edges extending between said sides;
complete first and second electrode arrays alternating with each other along an elongate region of each chip between said spaced parallel edges;
each first electrode array having a plurality of first electrodes and a plurality of second electrodes, with said first and second electrodes of said first electrode array being parallel to, and spaced from, each other and interdigitated along part of said elongate region;
a first common electrode for the first electrodes in said first electrode array, located at a first side of said elongate region;
means for individually connecting the second electrodes in each first electrode array to circuitry along individual connecting lead paths intersecting a plane through one of said parallel edges, including first individual terminals for the second electrodes in each first electrode array arranged side by side on an opposite second side of said elongate region of said chip along said one parallel edge, whereby each first individual terminal has an individual connecting lead path to said one paralle edge free of any other terminal, with any first individual terminal of any one of the second electrodes in any of said first electrode arrays being spaced from the first individual terminal of any other second electrode in the particular first electrode array by a center-to-center distance greater than the center-to-center spacing between said one second electrode and said adjacent second electrode; and each second electrode array having a plurality of first electrodes and a plurality of second electrodes, with the latter first and second electrodes of each second electrode array being parallel to, and spaced from, each other and interdigitated along part of said elongate region;

a second common electrode for the first electrodes in each second electrode array, located at said second side of said elongate region;

terminal means for said first and second common electrodes;

means for individually connecting the second electrodes in each second electrode array to circuitry along individual connecting lead paths intersecting a plane through the other of said parallel edges, including second individual terminals for the second electrodes in each second electrode array arranged side by side on said first side of said elongate region of said chip along said other parallel edge, whereby each second individual terminal has an individual connecting lead path to said other parallel edge free of any other terminal, with any second individual terminal of any one of the second electrodes in any of said second electrode arrays being spaced from the individual terminal of any other second electrode in the particular second electrode array by a center-to-center distance greater than the center-to-center spacing between the latter one second electrode and the latter other second electrode;

all individual first terminals and all individual second terminals for all of said complete first and second electrode arrays of each chip being present on that same chip; and means for providing one elongate light gate structure wherein electrodes and elongate light gate regions alternate along said plurality of individual rectangular chips, including means for mounting said chips side by side, with any two adjacent chips having a said first side of one of these two chips in abutment with a said second side of the other of these two chips;

a first one of said first electrodes in each chip extending along and coincident with said first side of the particular chip, and a second one of said first electrodes in the particular chip extending along and coincident with said second side of the particular chip; and said means for mounting said chips side by side arranging said chips into an elongate light gate structure, with any two adjacent chips having a said first one of said first electrodes of one of these two chips placed in abutment with a said second one of said first electrodes of the other of these two chips.

20. An elongate light gate structure comprising in combination:

a plurality of individual rectangular chips of electrooptically active light gate material display field induced birefringence;

a plurality of interdigitated first and second electrodes on each chip defining elongate light gate regions and extending parallel to opposite first and second sides of the particular rectangular chip, and a serpentine common electrode for said second electrodes having a first branch extending along and coincident with said first side, and a second branch extending along and coincident with said second side; and means for providing an elongate light gate structure having an overall serpentine common electrode formed of the serpentine common electrodes of the individual chips, including means for mounting said chips side by side, with a said first branch on a first chip of any two adjacent mounted chips abutting a said second branch on the second chip of these two adjacent mounted chips.

21. A structure as claimed in claim 20, wherein:
each of said first and second branches has a width smaller than the width of any second electrodes located between first electrodes on said chip.

22. A structure as claimed in claim 20, wherein:
each of said first and second branches has a width equal to one-half the width of any second electrode located between first electrodes on said chip.

23. A structure as claimed in claim 17, 18, 19, 20 or 21 including:

a rigid beam having a pair of spaced parallel elongate mounting surfaces of an elongate opening located between and extending along said mounting surfaces; and means connected to said rigid beam for mounting said chips side by side on said pair of mounting surfaces, with said light gate region being in registration with said opening.

24. A structure as claimed in claim 23, including:
an elongate filter; and
means connected to said rigid beam for mounting said filter on said rigid beam at said elongate opening in spaced relationship and parallel to said chips.

25. A structure as claimed in claim 23, including:
elongate focusing lens means; and
means connected to said rigid beam for mounting said focusing lens means on said rigid beam at said elongate opening in spaced relationship and parallel to said chips.

26. A structure as claimed in claim 23, including:
an elongate filter;
elongate focusing lens means; and
means connected to said rigid beam for mounting said filter and said lens means on said rigid beam at said elongate opening in spaced relationship and parallel to said chips.

27. A structure as claimed in claim 23, including:
elongate first and second filters;
means connected to said rigid beam for mounting said first filter on said rigid beam at said elongate opening on one side of and parallel to said chips; and
means for mounting said second filter on the opposite side of and parallel to said chips.

28. A structure as claimed in claim 17, 18, 20 or 21 including:

a rigid beam having a pair of spaced parallel elongate mounting surfaces and an elongate opening located between and extending along said mounting surfaces;

and a number of chip mounting clips; and means connected to said rigid beam and to said clips for mounting said chips side by side on said pair of mounting surfaces, with said light gate region being in registration with said opening.

29. A chip of electrooptically active light gate material displaying field induced birefringence, for assembly with other like chips in an elongate light gate structure, comprising in combination:

a plurality of interdigitated first and second electrodes on said chip defining elongate light gate regions and extending parallel to opposite first and second sides of the particular rectangular chip, and a serpentine common electrode for said second electrodes having a first branch extending along and coincident with said first side, and a second branch extending along and coincident with said second side, so that a said first branch of said chip and a said second branch of a said other like chip form part of an overall serpentine common electrode formed of the serpentine common electrodes of said chip and said other like chips including said first branch and including said second branch of said other like chip in abutting relationship when arranged side by side in said elongate light gate structure.

30. A structure as claimed in claim 29, wherein:
each of said first and second branches has a width smaller than the width of any second electrode located between first electrodes on said chip.

31. A structure as claimed in claim 29, wherein:
each of said first and second branches has a width equal to one-half the width of any second electrode located between first electrodes on said chip.

* * * * *